United States Patent
Wang (10) Patent No.: US 12,384,884 B2
(45) Date of Patent: Aug. 12, 2025

(54) POLYIMIDE COMPOSITE MATERIAL, MANUFACTURING METHOD THEREOF, AND DISPLAY SUBSTRATE

(71) Applicant: WUHAN CHINA STAR OPTOELECTRONICS SEMICONDUCTOR DISPLAY TECHNOLOGY CO., LTD., Hubei (CN)

(72) Inventor: Yamin Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 785 days.

(21) Appl. No.: 17/053,222

(22) PCT Filed: Jun. 30, 2020

(86) PCT No.: PCT/CN2020/099091
§ 371 (c)(1),
(2) Date: Nov. 5, 2020

(87) PCT Pub. No.: WO2021/208245
PCT Pub. Date: Oct. 21, 2021

(65) Prior Publication Data
US 2021/0324143 A1    Oct. 21, 2021

(30) Foreign Application Priority Data
Apr. 17, 2020  (CN) .......................... 202010304210.5

(51) Int. Cl.
C08G 73/10     (2006.01)
B82Y 30/00     (2011.01)
(Continued)

(52) U.S. Cl.
CPC ..... *C08G 73/1057* (2013.01); *C08G 73/1007* (2013.01); *C08G 73/1067* (2013.01);
(Continued)

(58) Field of Classification Search
CPC ...................... C08G 73/1057; C08G 73/1039; C08G 79/04; C08J 5/005; C08K 2003/2217
See application file for complete search history.

(56) References Cited

U.S. PATENT DOCUMENTS 6,057,035 A      5/2000  Singh et al.
7,455,886 B2 *  11/2008  Rao ...................... G02B 5/3083
                                                         524/430
(Continued)

FOREIGN PATENT DOCUMENTS

CN      101402796 A      4/2009
CN      101709212 A  *   5/2010
(Continued)

OTHER PUBLICATIONS

Study of Preparation and Properties of Polyimide/Nano Magnesium Oxide Material, Chinese Master's Thesis (ISSN 1674-0246, CN11-9144/G), (Year: 2017).*
(Continued)

*Primary Examiner* — Marc S Zimmer
*Assistant Examiner* — Surbhi M Du
(74) *Attorney, Agent, or Firm* — PV IP PC; Wei Te Chung (57) ABSTRACT

A polyimide composite material, a manufacturing method thereof, and a display substrate are provided. Inorganic nanoparticles are connected with polyimide structural units by chemical bonds, thus enhancing compatibility of the inorganic nanoparticles and the polyimide structural units. Moreover, because of an enhancement effect of the inorganic nanoparticles, a mechanical property and thermal stability of (Continued)

the polyimide composite material may be effectively improved.

7 Claims, 3 Drawing Sheets

(51) Int. Cl.
  *B82Y 40/00* (2011.01)
  *C08G 79/04* (2006.01)
  *C08J 5/00* (2006.01)
  *C08K 3/22* (2006.01)
  *H10K 77/10* (2023.01)

(52) U.S. Cl.
  CPC .............. *C08G 79/04* (2013.01); *C08J 5/005* (2013.01); *C08K 3/22* (2013.01); *B82Y 30/00* (2013.01); *B82Y 40/00* (2013.01); *C08G 73/1039* (2013.01); *C08G 73/1071* (2013.01); *C08K 2003/2217* (2013.01); *C08K 2201/011* (2013.01); *H10K 77/10* (2023.02); *H10K 77/111* (2023.02)

(56) References Cited

U.S. PATENT DOCUMENTS

| 2016/0208073 A1* | 7/2016 | Paranthaman | ........... C08J 7/123 |
| 2019/0127529 A1* | 5/2019 | Liu | ...................... H10K 85/111 |

FOREIGN PATENT DOCUMENTS

| CN | 103923330 A | 7/2014 |
| CN | 105111739 A | 12/2015 |
| CN | 110698682 A | 1/2020 |
| JP | 2014177554 A | 9/2014 |

OTHER PUBLICATIONS

Yoon et al. Synthesis and characterization of novel polyimides containing fluorine and phosphine oxide moieties, Polymer 42 (2001) 6019-6030 (Year: 2001).*

Kim et al. Effects of Thermal Curing on the Structure of Polyimide Film 1998, 30(3), pp. 229-233 (Year: 1998).*

Ying-long Li et al., "Study on Preparation and Properties of Polyimide Nano Magnesium Oxide Composite", Jul. 2014 (Abstract) (https://www.researchgate.net/publication/296835285_Studies_on_Preparation_and_Properties_of_PolyimideNano-MgO_Composites).

* cited by examiner

POLYIMIDE COMPOSITE MATERIAL, MANUFACTURING METHOD THEREOF, AND DISPLAY SUBSTRATE

The present disclosure claims priority to china application No. 202010304210.5 entitled "a polyimide composite material, a manufacturing method thereof, and a substrate" filed to China National Intellectual Property Administration (CNIPA) on Apr. 17, 2020, the entire contents of which are incorporated by reference herein.

FIELD OF INVENTION

The present disclosure relates to the technical field of functional material, and particularly, to a polyimide composite material, a manufacturing method thereof, and a display substrate.

BACKGROUND OF INVENTION

Conventional polyimide material features a dense and rigid structure as well as a strong intermolecular interaction. However, pure polyimide has been rarely used for production at present since various properties of the pure polyimide has difficulty in reaching a standard of a comprehensive property. For example, a tensile property of the pure polyimide may usually only reach about 10%, which limits applications in certain fields. For instance, in storage and display fields, the polyimide is required to have high heat resistance (i.e., losing a weight of 1 wt % at 560° C.), fracture stress reaching 350 MPa, and elongation at break reaching above 15%. Because of a desirable structure adjustment of the polyimide, manufacturing a reinforced composite polyimide has become a subject which is increasingly concerned by the application fields.

Therefore, a polyimide composite material, a manufacturing method thereof, and a substrate are urgently required to solve the above-mentioned problems.

SUMMARY OF INVENTION

Technical Problem

A purpose of the present disclosure is to solve the above-mentioned problems. The present disclosure provides a polyimide composite material, a manufacturing method thereof, and a substrate. Inorganic nanoparticles are connected with polyimide structural units by chemical bonds, thus enhancing compatibility of the inorganic nanoparticles and the polyimide structural units. Moreover, because of an enhancement effect of the inorganic nanoparticles, a mechanical property and thermal stability of the material may be effectively improved.

Technical Solutions

The present disclosure provides a polyimide composite material. A molecule structure of the polyimide composite material includes polyimide structural units and inorganic nanoparticles, wherein the polyimide structural unit includes at least one of a carbonyl bond or a phenylphosphine oxide group; the inorganic nanoparticles are at least one of magnesium oxide nanoparticles, calcium ethoxide nanoparticles, or barium ethoxide nanoparticles; and the inorganic nanoparticle is connected with the carbonyl bond or the phenylphosphine oxide group by a chemical bond.

Furthermore, the polyimide structural unit includes a phenylphosphine oxide group.

Furthermore, a formula of the polyimide structural unit is at least one of a formula I-1, a formula I-2, or a formula I-3, as shown in the following:

Moreover, the inorganic nanoparticles are one or more of the magnesium oxide nanoparticles, the calcium ethoxide nanoparticles, or the barium ethoxide nanoparticles.

The present disclosure further provides a manufacturing method of a polyimide composite material. The manufacturing method includes:

a step S1 of performing a polymerization reaction of diamine and dianhydride to obtain a polyamic acid solution;

a step S2 of introducing inorganic nanoparticles into the polyamic acid solution to obtain a mixture solution of the polyamic acid and the inorganic nanoparticles; and a step S3 of cross-linking the polyamic acid and the inorganic nanoparticles in the mixture solution followed by curing, so as to obtain the polyimide composite material;

wherein a molecule structure of the polyimide composite material includes polyimide structural units and the inorganic nanoparticles, the polyimide structural unit includes at least one of a carbonyl bond or a P=O bond, and the inorganic nanoparticle is connected with the carbonyl bond or the P=O bond by a chemical bond.

Furthermore, the diamine includes a phenylphosphine oxide group.

Furthermore, the diamine is at least one of following compounds:

Moreover, the inorganic nanoparticles are at least one of magnesium oxide nanoparticles, nano-calcium ethoxide nanoparticles, or nano-barium ethoxide nanoparticles.

Moreover, the functional devices may be thin film transistors (TFT) or organic electroluminescent devices (OLED).

Advantageous Effects

The advantageous effects of the present disclosure are that: in the polyimide composite material described by the present disclosure, the inorganic nanoparticles are connected with the carbonyl bonds or the P=O bonds of the polyimide structural units by covalent bonds, thus enhancing the compatibility of the polyimide and the inorganic nanoparticles. Moreover, because of the enhancement effect of the inorganic nanoparticles, heat resistance of the polyimide composite material is enhanced, thereby improving a mechanical property and thermal stability of the polyimide composite material. The polyimide composite material described by the present disclosure further has a desirable bending resistance property, so that the polyimide composite material may be used to manufacture the substrate described by the present disclosure and the display substrate described by the present disclosure, thus facilitating achieving flexible bending of the display panel.

Moreover, the dianhydride is at least one of 4,4'-diphenyl ether dianhydride, 3,3',4,4'-biphenyltetracarboxylic dianhydride, or 3,3',4,4'-benzophenone tetracarboxylic dianhydride.

The present disclosure further provides a display substrate. The display substrate includes a substrate, and functional devices disposed on the substrate, wherein material of the substrate includes at least one of polyimide composite materials, and a molecule structure of the polyimide composite material includes polyimide structural units and inorganic nanoparticles; the polyimide structural unit includes at least one of a carbonyl bond or a P=O bond; and the inorganic nanoparticle is connected with the carbonyl bond or the P=O bond by a chemical bond.

Furthermore, the polyimide structural unit includes a phenylphosphine oxide group.

Furthermore, a formula of the polyimide structural unit is at least one of a formula I-1, a formula I-2, or a formula I-3, as shown in the following:

DESCRIPTION OF DRAWINGS

By illustrating specific implementations of the present disclosure in conjunction with accompanying drawings in detail below, technical solutions and other advantageous effects are clear.

DETAILED DESCRIPTION OF PREFERRED EMBODIMENTS

Specific structures and function details disclosed herein are merely representative, and are used for a purpose of describing exemplary embodiments of the present disclosure. However, the present disclosure may be specifically implemented in many alternative forms, and should not be interpreted as being limited only to the embodiments set forth herein.

In the description of the present disclosure, it should be understood that indicative directions or position relations, such as terms "center", "transverse", "upper", "lower", "left", "right", "vertical", "horizontal", "top", "bottom", "inner", and "outer", are based on directions or position relations indicated by the accompanying drawings. The indicative directions or position relations are only for convenience of describing the present disclosure and simplifying the description, and do not indicate or imply that indicated devices or elements must have a specific orientation and be constructed and operated in a specific orientation. Therefore, the indicative directions or position relations cannot be understood to be limitation to the present disclosure. In addition, terms, such as "first" and "second", are only used for purposes of description, and do not be understood to indicate or imply relative importance or to imply numbers of indicated technical features. Thus, the features defined with "first" and "second" may explicitly or implicitly include one or more of the features. In the description of the present disclosure, term "a plurality of" means two or more than two, unless specified otherwise. Additionally, term "comprise" and any other variations thereof are intended to "include but not exclude".

In the description of the present disclosure, it should be noted that unless specified or limited otherwise, terms "mounted", "linked", and "connected" are understood broadly, and may be, for example, supported connection, detachable connection or integral connection; may be mechanical connection or electrical connection; may be direct connection or indirect connection via intermediate media; may be inner communication of two elements. For those of ordinary skill in the art, the specific meaning of the above-mentioned terms in the present disclosure may be understood according to specific situations.

The terms used herein are only for describing the specific embodiments, and are not intended to limit the exemplary embodiments. Unless the context clearly indicates otherwise, singular forms "a" and "one" used herein are also intended to include the plural forms. It should be understood that the terms "include" and/or "comprise" used herein specify existence of stated features, integrals, steps, operations, units, and/or components, and do not exclude existence or addition of one or more other features, integrals, steps, operations, units, components, and/or combinations thereof.

The present disclosure is further illustrated in combination with accompanying drawings and the embodiments below.

The present disclosure provides a polyimide composite material. A molecule structure of the polyimide composite material includes polyimide structural units and inorganic nanoparticles. The polyimide structural unit includes at least one of a carbonyl bond or a P=O bond, and the inorganic nanoparticle is connected with the carbonyl bond or the P=O bond by a chemical bond.

Specifically, the polyimide structural unit includes a phenylphosphine oxide group. For example, the polyimide structural unit including the phenylphosphine oxide group is one or more of following formulas:

In the embodiment, the polyimide structure unit employs the formula I-1, as shown in the following:

Specifically, the inorganic nanoparticle is connected with the carbonyl bond or the P=O bond by a covalent bond.

Specifically, material of the inorganic nanoparticles is inorganic oxide. In other words, the inorganic nanoparticles are inorganic oxide nanoparticles. In the embodiment, the inorganic nanoparticles are at least one of calcium ethoxide nanoparticles, barium ethoxide nanoparticles, or magnesium oxide nanoparticles (or called nanoparticles of magnesium oxide).

In other embodiments, the inorganic nanoparticles may also be one or more of carbon nanotubes, silicon dioxide nanoparticles, zinc oxide nanoparticles, titanium dioxide nanoparticles, aluminum nitride nanoparticles, or aluminum oxide nanoparticles.

In the embodiment, the inorganic nanoparticles employ the magnesium oxide nanoparticles. The magnesium oxide nanoparticles have a small size effect, a surface effect, a quantum size effect and a macroscopic tunneling effect, and do not generate agglomeration after being subjected to modification treatment In the embodiment, the inorganic nanoparticles play a reinforcing role in the molecule structure in which the inorganic nanoparticles exist. In this case, since the inorganic nanoparticles are connected with the polyimide structural units by the chemical bonds, rather than adding the inorganic nanoparticles by a simple doping method, the compatibility of the polyimide and the inorganic nanoparticles is enhanced. Moreover, because of the enhancement effect of the inorganic nanoparticles, heat resistance of the polyimide composite material is enhanced, thereby improving a mechanical property and thermal stability of the polyimide composite material.

The present disclosure further provides a manufacturing method of a polyimide composite material, and the polyimide composite material described by the present disclosure may be manufactured by this method. The manufacturing method includes:
  a step S1 of performing a polymerization reaction of diamine and dianhydride to obtain a polyamic acid solution;
  a step S2 of introducing inorganic nanoparticles into the polyamic acid solution to obtain a mixture solution of the polyamic acid and the inorganic nanoparticles; and
  a step S3 of cross-linking the polyamic acid and the inorganic nanoparticles in the mixture solution followed by curing, so as to obtain the polyimide composite material;
  wherein a molecule structure of the polyimide composite material includes polyimide structural units and the inorganic nanoparticles which are connected with the polyimide structural units by chemical bonds.

In general, the three manufacturing steps of the polyimide composite material may be correspondingly summarized that: (1) the polyamic acid solution is manufactured, (2) the mixture solution of the polyamic acid and the inorganic nanoparticles is manufactured, and (3) the polyamic acid and the inorganic nanoparticles in the mixture solution are cross-linked and cured. The manufacturing method of the polyimide composite material and the implementation of each step are set forth in detail below.

(1) The polyamic acid solution is manufactured.

A purpose of the step is that the polyamic acid for manufacturing the polyimide composite material is obtained by mixing the diamine and the dianhydride. Hereinafter, the polyamic acid (PAA) is called compound C, the diamine monomer for manufacturing the polyamic acid is called compound A, and the dianhydride for manufacturing the polyamic acid is called compound B.

Specifically, the compound A includes the phenylphosphine oxide group and a diamino group. For example, the compound A is one or more of the following compounds:

In the embodiment, the compound A is diamino-bis(3-aminophenyl)-3,5-bis(trifluoromethyl)phenyl phosphine oxide, as shown in the following:

By selecting the compound A including the phenylphosphine oxide group, the P=O bond may be introduced in the polyimide composite material.

Specifically, the compound B is one or more of 4,4'-diphenyl ether dianhydride, 3,3',4,4'-biphenyltetracarboxylic dianhydride, or 3,3',4,4'-benzophenone tetracarboxylic dianhydride. Structural formulas of 4,4'-diphenyl ether dianhydride, 3,3',4,4'-biphenyltetracarboxylic dianhydride, and 3,3',4,4'-benzophenone tetracarboxylic dianhydride are shown in the following:

In the specific implementation, the compound B may also be selected from other kinds of aromatic dianhydrides containing benzene rings, for example, but not limited to, pyromellitic dianhydride, 4,4'-oxydiphthalic dianhydride, 2,3,3',4'-biphenyltetracarboxylic dianhydride, 4,4'-(4,4'-isopropyl diphenoxy) diphthalic anhydride, 3,3',4,4'-Diphenyl ether tetracarboxylic dianhydride, 2,3,3',4'-Diphenyl ether tetracarboxylic dianhydride, and 3,3',4,4'-Triphenyl diether tetracarboxylic dianhydride.

In comparison with other types of the dianhydride, by employing the aromatic dianhydrides, a higher mechanical strength may be introduced in the polyimide composite material, and a regularity of molecular chains of the polyimide composite material is improved.

Specifically, the polyamic acid solution is manufactured by using following ways:
 a. The compound A is dissolved in an aprotic solvent to obtain a reaction solution of compound A;
 b. The compound A is dissolved in another aprotic solvent to obtain a reaction solution of compound B; and
 c. The reaction solution of compound A and the reaction solution of compound B are mixed, stirred, vacuum filtrated, vacuum extracted, and stood, so as to obtain the polyamic acid solution.

In the specific implementation, the aprotic solvent is one or more of N,N-dimethylacetamide, N,N-dimethylformamide, N-methylpyrrolidone, and dimethylsulfoxide. For example, a mixture of N,N-dimethylhexanamide (DMAC) and N-methylpyrrolidone (NMP) is chosen to be the aprotic solvent, and DMAC/NMP=v/v=0.2-2.

(2) The mixture solution of the polyamic acid and the inorganic nanoparticles is manufactured.

A purpose of the step is that the inorganic nanoparticles are introduced into the polyamic acid solution to obtain the mixture solution of the polyamic acid and the inorganic nanoparticles.

Specifically, material of the inorganic nanoparticles is inorganic oxide. In other words, the inorganic nanoparticles are inorganic oxide nanoparticles, for example, but not limited to, calcium ethoxide nanoparticles, barium ethoxide nanoparticles, or magnesium oxide nanoparticles.

Specifically, a kind of the inorganic nanoparticles may be introduced into the polyamic acid solution by using following ways. A reactive additive D corresponding to this kind of the inorganic nanoparticles are first obtained, and then the reactive additive D is added into the polyamic acid solution, which is followed by stirring, so that this kind of the inorganic nanoparticles may be introduced into the polyamic acid solution, thereby obtaining the corresponding mixture solution of the polyamic acid and the inorganic nanoparticles.

For example, by adding magnesium ethoxide as the reactive additive D into the polyamic acid solution and stirring the mixture, the magnesium oxide nanoparticles may be introduced into the polyamic acid solution to obtain the mixture of the polyamic acid and magnesium oxide (i.e., the PAA/MgO mixture).

It is noted that the above content is only an implementation method for introducing the inorganic nanoparticles into the polyamic acid solution. In other embodiments, other conventional manufacturing method in the field may be employed to obtain the mixture solution of the polyamic acid and the inorganic nanoparticles.

(3) The polyamic acid and the inorganic nanoparticles in the mixture solution are cross-linked and cured.

In this step, by performing a constant temperature recipe on the mixture solution of the polyamic acid and the inorganic nanoparticles, the polyamic acid is cross-linked and cured to form the polyimide. Additionally, the inorganic nanoparticles are connected with the carbonyl bonds and the P=O bonds by the chemical bonds, thereby finally obtaining the polyimide composite material (called a compound F) involved in the present disclosure.

In combination with a process of forming a polyimide film layer on a substrate with the polyimide composite material involved in the present disclosure, the cross-linking and curing process of the mixture solution of the polyamic acid and the inorganic nanoparticles is further set forth and illustrated below.

The mixture solution of the polyamic acid and the inorganic particles obtained from the above steps is spin-coated on a substrate by a slit coater. Following the coating step, a high temperature-vacuum dry (H-VCD) process is performed on the substrate to remove 40%-70% of the solvent. Finally, the constant temperature recipe is performed on the substrate to allow the polyamic acid in the mixture solution of the polyamic acid and the inorganic particles coated on the substrate to undergo a dehydration and cyclization reaction, so that the polyamic acid is cross-linked and cured to generate the polyimide, and additionally, the inorganic nanoparticles are connected with the polyimide by the chemical bonds.

FIGS. 1 to 5 respectively are the embodiments of performing the constant temperature recipe to the substrate, and implementation particulars of the constant temperature recipe are set forth and illustrated in detail in combination with FIGS. 2 to 5 below. It is worth pointing out that the process of performing the constant temperature recipe to the substrate has various implementation solutions, and FIG. 1 to FIG. 4 are merely four preferred embodiments of the constant temperature recipe. In other embodiments, other implementation solutions of the constant temperature recipe may also be chosen, and the present disclosure is not limited thereto.

Figure 1:
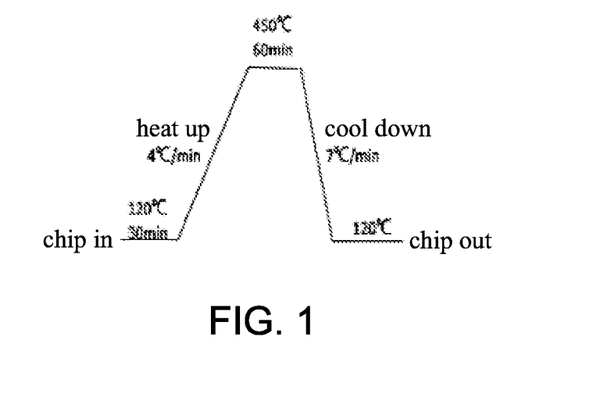
FIG. 1 is a schematic view of a process of a first embodiment of a constant temperature recipe described by the present disclosure.

FIG. 1 is a schematic view of a process of a first embodiment of the constant temperature recipe described by the present disclosure. As shown in FIG. 1, in the embodiment, the constant temperature recipe includes a step of heating up once and maintaining the temperature, and a highest temperature is 450° C.

Figure 2:
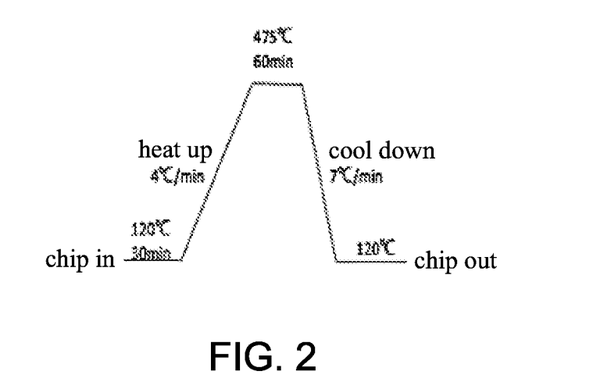
FIG. 2 is a schematic view of a process of a second embodiment of the constant temperature recipe described by the present disclosure.

FIG. 2 is a schematic view of a process of a second embodiment of the constant temperature recipe described by the present disclosure. As shown in FIG. 2, in the embodiment, the constant temperature recipe includes a step of heating up once and maintaining the temperature, and a highest temperature is 475° C.

Figure 3:
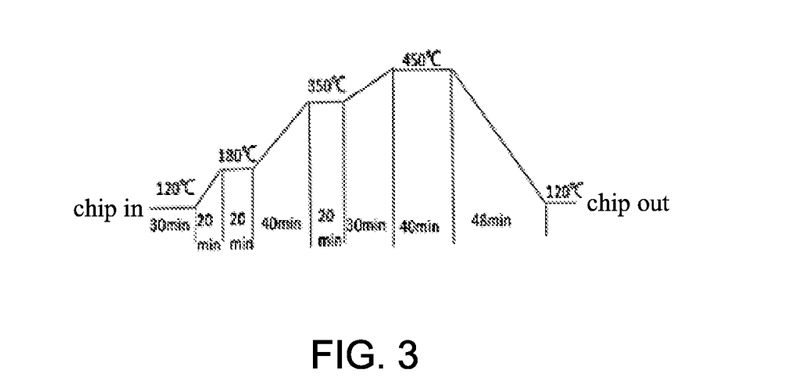
FIG. 3 is a schematic view of a process of a third embodiment of the constant temperature recipe described by the present disclosure.

FIG. 3 is a schematic view of a process of a third embodiment of the constant temperature recipe described by the present disclosure. As shown in FIG. 3, in the embodiment, the constant temperature recipe includes steps of heating up three times and maintaining the temperatures three times, and a highest temperature reaches 450° C. The temperatures of 180° C. and 350° C. are respectively maintained for 20 min, and the temperature of 450° C. is maintained for 40 min.

Figure 4:
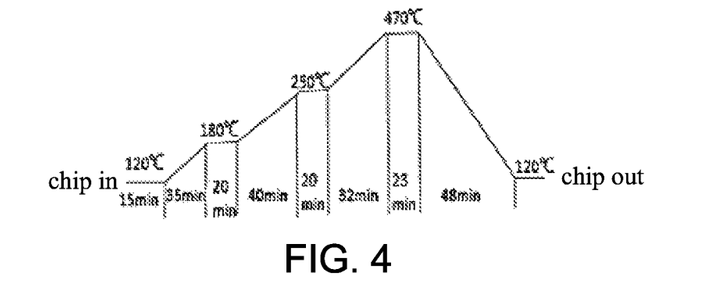
FIG. 4 is a schematic view of a process of a fourth embodiment of the constant temperature recipe described by the present disclosure.

FIG. 4 is a schematic view of a process of a fourth embodiment of the constant temperature recipe described by the present disclosure. As shown in FIG. 4, in the embodiment, the constant temperature recipe includes steps of heating up three times and maintaining the temperatures three times, and a highest temperature reaches 450° C. The temperatures of 180° C. and 250° C. are respectively maintained for 20 min, and the temperature of 470° C. is maintained for 23 min.

In combination with the specific embodiments, the manufacturing processes and particulars of the polyimide composite material described by the present disclosure are set forth and illustrated below.

A First Embodiment

In the embodiment, diamino-bis(3-aminophenyl)-3,5-bis (trifluoromethyl)phenyl phosphine oxide is chosen to be the compound A, 4,4'-diphenyl ether dianhydride is chosen to be the compound B, the magnesium oxide nanoparticles are chosen to be the inorganic nanoparticles, magnesium ethoxide is chosen to be the compound D, and the mixture of N,N-dimethylhexanamide (DMAC) and N-methylpyrrolidone (NMP) is chosen to be the aprotic solvent in which the DMAC/NMP=v/v=0.2-2, so as to manufacture the polyimide composite material.

1.5-10 mmol diamino-bis(3-aminophenyl)-3,5-bis(trifluoromethyl)phenyl phosphine oxide is weighed and dissolved in the aprotic solvent, and the mixture is evenly stirred to obtain a first reaction solution. 1.5-17 mmol 4,4'-diphenyl ether dianhydride is weighed and dissolved in the aprotic solvent, and the mixture is evenly stirred to obtain a second reaction solution. The second reaction solution is added into the first reaction solution, which is followed by stirring at room temperature for 24-96 hours, thus making the second reaction solution be fully dissolved. Then, the mixture of the first reaction solution and the second reaction solution is suction-filtrated in a vacuum environment, the solution obtained by the suction-filtration is evacuated by a vacuum pump for 1 hour, and then the solution is stood at room temperature for 2-4 hours after evacuating to further decrease bubbles in the solution until no bubbles visualized by naked eyes, thus obtaining the polyamic acid solution (i.e., the compound C). A specific reaction route is shown as the following figure:

An appropriate amount of magnesium ethoxide is dissolved in the aprotic solvent to obtain the magnesium ethoxide solution with a concentration of 1-3 mmol/L. The 10-160 mL magnesium ethoxide solution is added into the polyamic acid solution, which is followed by stirring for 15-40 min until no bubbles visualized by the naked eyes, thus obtaining the mixture solution of the polyamic acid and magnesium oxide. A reaction route is shown as the following figure:

The mixture solution of the polyamic acid and magnesium oxide is spin-coated on a substrate by a slit coater. Following the coating step, the H-VCD (vacuum and drying) process is performed on the substrate for about 10 min-30 min to remove 40%-70% of the solvent. Finally, the constant temperature recipe is performed on the substrate to allow the polyamic acid and magnesium oxide in the mixture solution coated on the substrate to be cross-linked and cured, so as to generate the polyimide composite material. A reaction route is shown as the following figure:

A Second Embodiment

A great difference from the first embodiment is that 3,3',4,4'-biphenyltetracarboxylic dianhydride is chosen to be the compound B to synthesize the polyimide composite material in this embodiment. In the embodiment, a reaction route for manufacturing the polyimide composite material is shown as the following figure:

A Third Embodiment

Figure 5:
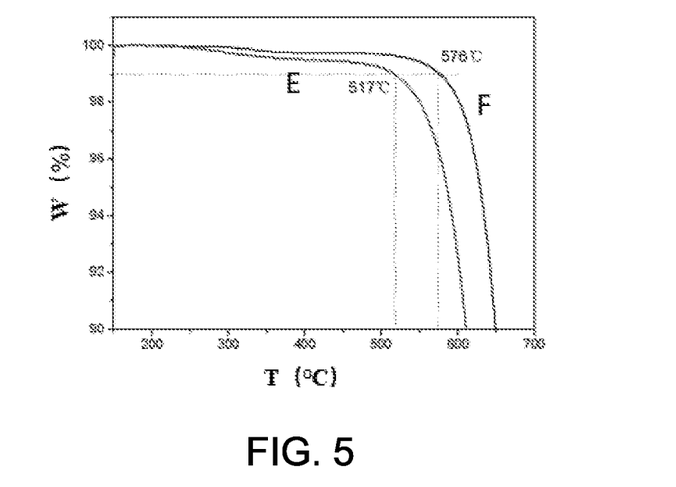
FIG. 5 is a schematic view of a thermogravimetric analysis (TGA) of a polyimide composite material provided by the present disclosure and a conventional polyimide material, wherein E and F respectively represent the conventional polyimide material and the polyimide composite material provided by the present disclosure.
Figure 6:
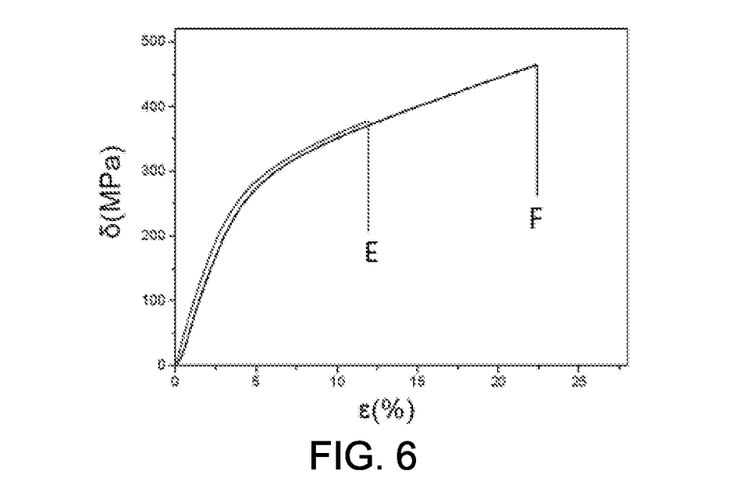
FIG. 6 is stress strain curves of a polyimide composite material provided by the present disclosure and a conventional polyimide material, wherein E and F respectively represent the conventional polyimide material and the polyimide composite material provided by the present disclosure.

A great difference from the first embodiment is that 3,3',4,4'-benzophenone tetracarboxylic dianhydride is chosen to be the compound B to synthesize the polyimide composite material in this embodiment. In the embodiment, a reaction route for manufacturing the polyimide composite material is shown as the following figure:

FIG. 5 is a schematic view of a thermogravimetric analysis (TGA) of a polyimide composite material provided by the present disclosure and a conventional polyimide material. FIG. 6 is stress strain curves of a polyimide composite material provided by the present disclosure and a conventional polyimide material. The conventional polyimide material and the polyimide composite material provided by the present disclosure are respectively called a compound E and a compound F.

Referring to FIG. 5, a 1% weight-loss temperature of the conventional polyimide material (the compound E) is 517° C., and a 1% weight-loss temperature of the polyimide composite material (the compound F) described by the present disclosure reaches 576° C. The 1% weight-loss temperature of the polyimide composite material described by the present disclosure is raised up by approximately 60° C. Clearly, by comparing these two polyimide materials, the present disclosure which involves this polyimide composite material reinforced by the inorganic nanoparticles has a certain advantage of this parameter performance. The foregoing content also proves that the inorganic nanoparticles are connected with the carbonyl bonds or the P=O bonds in the polyimide structure units by the covalent bonds, thus enhancing the compatibility of the polyimide and the inorganic nanoparticles. Moreover, because of the enhancement effect of the inorganic nanoparticles, the heat resistance of the polyimide composite material may be improved.

Furthermore, a tensile test is performed to the conventional polyimide material and the polyimide composite material described by the present disclosure, respectively. Referring to FIG. 6, in the conventional polyimide material, a maximum stress $\delta max$ is 376.3 MPa, and a $\epsilon max$ is 11.75%; in the polyimide composite material described by the present disclosure, a tensile property $\delta max$ is 465.5 MPa, and a $\epsilon max$ is 22.4%.

It may be seen from the above-mentioned parameters that by introducing the inorganic nanoparticles, the tensile properties of the polyimide composite material described by the present disclosure may have the following variations: the maximum stress is increased from 376.3 MPa to 465.5 MPa, so the maximum stress is increased by 23.7%, and an elongation at break is increased from 11.75% to 22.4%, so the elongation at break is increased by 90.6%.

Clearly, in comparison with the tensile property of the conventional polyimide material, the tensile property of the polyimide composite material involved in the present disclosure is significantly improved, which may clearly prove that the introduced inorganic nanoparticles play a reinforcing role in the final molecular structure of the polyimide composite material involved in the present disclosure.

The present disclosure further provides a substrate. Material of the substrate includes one or more of the polyimide composite materials described by the present disclosure.

As described above, the tensile property and a bending resistance property of the polyimide composite material described by the present disclosure are significantly improved, thereby significantly advancing a flexible property of the substrate described by the present disclosure. In other words, the substrate described by the present disclosure may serve as a flexible substrate, or is used in a flexible display panel.

Figure 7:
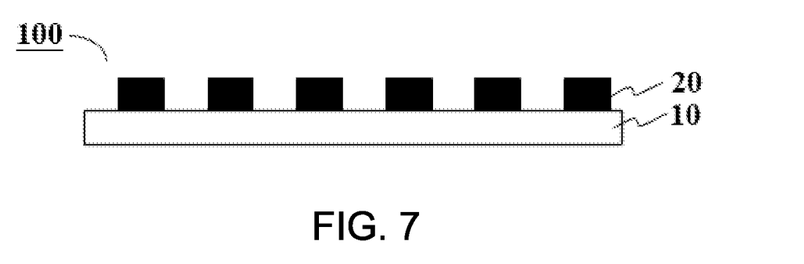
FIG. 7 is a structural schematic view of an embodiment of a display substrate of the present disclosure.

As shown in FIG. 7, the present disclosure further provides a display substrate 100. The display substrate 100 includes a substrate 10 and functional devices 20 disposed on the substrate 10.

Material of the substrate 10 is one or more of the polyimide composite materials described by the present disclosure, or the substrate 10 is the substrate described by the present disclosure. By employing the polyimide composite material described by the present disclosure or the substrate described by the present disclosure, the bending resistance property of the display substrate 100 is improved, thus facilitating achieving the flexible display.

Specifically, the functional devices 20 may be thin film transistors (TFT) or organic electroluminescent devices (OLED).

In an embodiment, the functional devices 20 are the thin film transistors (TFT), and the display substrate 100 may correspondingly be an array substrate.

In another embodiment, the functional devices 20 are the organic electroluminescent devices (OLED), and the display substrate 100 may correspondingly be the display panel. In the specific implementation, a driving circuit for driving the functional devices 20 may be disposed on the substrate 10.

However, it should be noted that the polyimide composite material involved in the present disclosure is not limited to be used for the substrate or the display substrate, and may be used in various suitable application situation, as long as the property parameters of the target composites obtained in accordance with different proportions of raw material meet requirements.

In summary, although the present disclosure has been disclosed by above preferred embodiments, the above preferred embodiments do not intend to limit the present disclosure, and those skilled in the art may make various changes and modifications without departing from the spirit and the scope of the present disclosure. Therefore, the protection scope of the present disclosure is defined by the scope of the claims.

What is claimed is:

1. A polyimide composite material, comprising: a molecule structure including polyimide structural units and inorganic nanoparticles,
   wherein each of the polyimide structural units comprises at least one of a formula I-1, a formula I-2, or a formula I-3, as shown in the following:

formula I-1 formula I-2

, or formula I-3

;

wherein the inorganic nanoparticles are at least one of magnesium oxide nanoparticles, calcium ethoxide nanoparticles, or barium ethoxide nanoparticles; and wherein the inorganic nanoparticles are connected with a carbonyl bond of an imide ring structure or a phenylphosphine oxide group of each of the polyimide structural units by a chemical bond.

2. A manufacturing method of a polyimide composite material, comprising:
   a step S1 of performing a polymerization reaction of diamine and dianhydride to obtain a polyamic acid solution;
   a step S2 of introducing inorganic nanoparticles into the polyamic acid solution to obtain a mixture solution of the polyamic acid and the inorganic nanoparticles; and
   a step S3 of cross-linking the polyamic acid and the inorganic nanoparticles in the mixture solution followed by curing, so as to obtain the polyimide composite material;
   wherein a molecule structure of the polyimide composite material includes polyimide structural units and the inorganic nanoparticles,
   each of the polyimide structural units comprises at least one of a formula I-1, a formula I-2, or a formula I-3, as shown in the following:

the inorganic nanoparticles are at least one of magnesium oxide nanoparticles, calcium ethoxide nanoparticles or barium ethoxide nanoparticles, and the inorganic nanoparticles are connected with a carbonyl bond of an imide ring structure or a P=O bond of each of the polyimide structural units by a chemical bond.

3. The manufacturing method of the polyimide composite material according to claim 2, wherein the dianhydride is at least one of 4,4'-diphenyl ether dianhydride, 3,3',4,4'-4 biphenyltetracarboxylic dianhydride, or 3,3',4,4'-benzophenone tetracarboxylic dianhydride.

4. A display substrate, comprising: a substrate, and functional devices disposed on the substrate, wherein material of the substrate includes at least one of polyimide composite materials, and a molecule structure of the polyimide composite material includes polyimide structural units and inorganic nanoparticles;

wherein each of the polyimide structural units comprises at least one of a formula I-1, a formula I-2, or a formula I-3, as shown in the following:

wherein the inorganic nanoparticles are at least one of magnesium oxide nanoparticles, calcium ethoxide nanoparticles or barium ethoxide nanoparticles, and the inorganic nanoparticles are connected with a carbonyl bond of an imide ring structure or a P=O bond of each of the polyimide structural units by a chemical bond.

5. The polyimide composite material according to claim 1, wherein a temperature beyond 300° C. at which 1% of weight loss of the polyimide composite material occurs is greater than a temperature at which 1% of weight loss of the corresponding polyimide structural units occurs.

6. The manufacturing method of the polyimide composite material according to claim 2, wherein a temperature beyond 300° C. at which 1% of weight loss of the polyimide composite material occurs is greater than a temperature at which 1% of weight loss of the corresponding polyimide structural units occurs.

7. The polyimide composite material according to claim 4, wherein a temperature beyond 300° C. at which 1% of weight loss of the polyimide composite material occurs is greater than a temperature at which 1% of weight loss of the corresponding polyimide structural units occurs.

* * * * *